US008218330B2

(12) United States Patent
Bang et al.

(10) Patent No.: US 8,218,330 B2
(45) Date of Patent: Jul. 10, 2012

(54) REWORKABLE PASSIVE ELEMENT EMBEDDED PRINTED CIRCUIT BOARD

(75) Inventors: Hyo-jae Bang, Cheonan-si (KR); Dong-chun Lee, Cheonan-si (KR); Seong-chan Han, Cheonan-si (KR); Jun-young Lee, Yongin-si (KR); Jung-hyeon Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 718 days.

(21) Appl. No.: 11/862,521

(22) Filed: Sep. 27, 2007

(65) Prior Publication Data

US 2008/0079118 A1    Apr. 3, 2008

(30) Foreign Application Priority Data

Oct. 2, 2006    (KR) .................. 10-2006-0097405

(51) Int. Cl.
  *H05K 1/18*    (2006.01)
(52) U.S. Cl. ...................... 361/761; 361/763
(58) Field of Classification Search .............. 361/761, 361/763
  See application file for complete search history.

(56) References Cited

U.S. PATENT DOCUMENTS

| 2004/0022038 | A1* | 2/2004 | Figueroa et al. | 361/763 |
| 2004/0231884 | A1* | 11/2004 | Wong et al. | 174/252 |
| 2006/0054352 | A1* | 3/2006 | Ryu et al. | 174/260 |

FOREIGN PATENT DOCUMENTS

| JP | 05218615 A | 8/1993 |
| JP | 09074043 A | 3/1997 |
| KR | 1020060024946 A | 3/2006 |

OTHER PUBLICATIONS

Machine translation of Ryu (KR 10-2006-0024946).*

* cited by examiner

*Primary Examiner* — Cuong Q Nguyen
*Assistant Examiner* — Hsin-Yi Hsieh
(74) *Attorney, Agent, or Firm* — Volentine & Whitt, PLLC (57) ABSTRACT

A reworkable passive element embedded printed circuit board (PCB) including a board member, first and second fillings, and a first passive element. The board member has first and second through holes which are spaced apart from each other. The first and second fillings are buried in the first and second through holes, respectively, and formed of a reflowable conductive material. The first passive element includes first and second electrodes. A first insertion groove is formed in a portion of a surface of the board member between the first and second through holes and portions of the first and second fillings. The first passive element is mounted on the first insertion groove. The first electrode includes a bottom surface and a side contacting the first filling and an exposed upper surface. The second electrode comprises a bottom surface and a side contacting the second filling and an exposed upper surface.

15 Claims, 9 Drawing Sheets

REWORKABLE PASSIVE ELEMENT EMBEDDED PRINTED CIRCUIT BOARD

CROSS-REFERENCE TO RELATED APPLICATION

This U.S. non-provisional patent application claims priority under 35 U.S.C §119 of Korean Patent Application 10-2006-0097405 filed on Oct. 2, 2006, the entire contents of which are hereby incorporated by reference.

BACKGROUND OF THE INVENTION

1. Field of the Invention

Embodiments of the invention relate to a passive element embedded printed circuit board (PCB). More particularly, embodiments of the invention relate to a reworkable passive element embedded PCB and a method of fabricating the same.

2. Discussion of Related Art

Figure 1A:
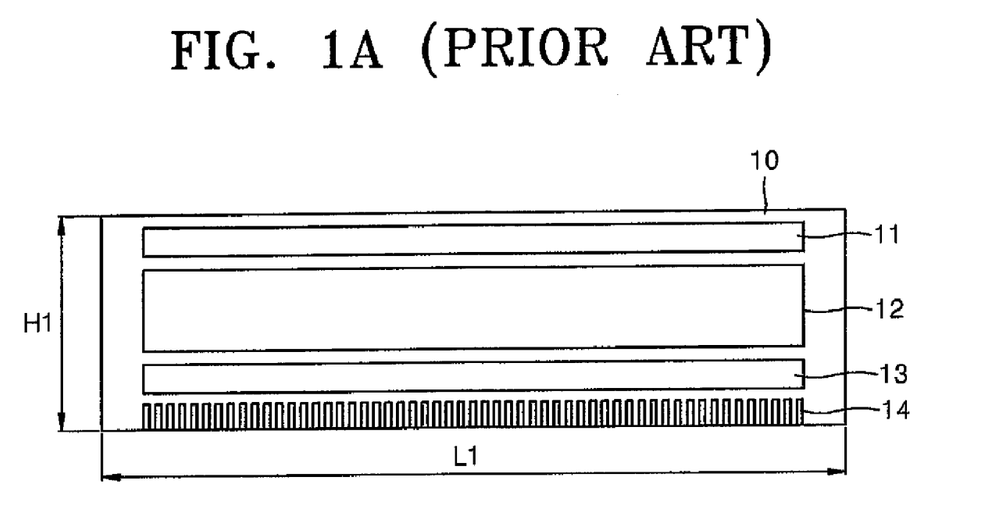
FIG. 1A is a plan view of a conventional semiconductor module.
Figure 1B:
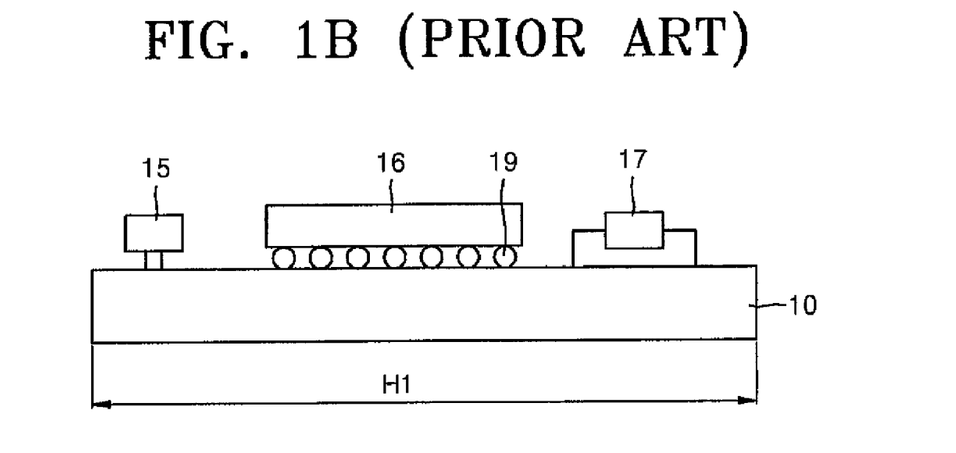
FIG. 1B is a cross-sectional view of the semiconductor module of FIG. 1A.

FIG. 1A is a top plan view of a conventional semiconductor module, and FIG. 1B illustrates printed circuit board (PCB) 10 on which passive elements and a semiconductor package are mounted. FIG. 1B is a cross-sectional view of the semiconductor module shown in FIG. 1A. PCB 10 is largely divided into first area 12, second area 11 and third area 13. PCB 10 includes a terminal part 14 in which a plurality of pins are arranged for an electrical connection to an electronic product. A semiconductor package 16 is mounted in first area 12, a capacitive passive element 15 is mounted in second area 11, and a resistive passive element 17 is mounted in third area 13. Capacitive passive element 15 may include, for example, a decoupling capacitor which reduces power noise of the conventional semiconductor module. Resistive passive element 17 may include, for example, a resistor which reduces noise of a reflected signal wave. Terminal part 14 accommodates mounting of PCB 10. PCB 10 has a first length L1 and a first height H1. Second area 11 is disposed above first area 12 and third area 13 is disposed under first area 12. Semiconductor package 16 is mounted in first area 12 through solder balls 19. Capacitive passive element 15 is mounted in second area 11 and resistive passive element 17 is mounted in third area 13.

In a conventional semiconductor module, semiconductor package 16 is mounted in the center of PCB 10, and capacitive passive element 15 and resistive passive element 17 are arranged over and under the semiconductor package 16. Therefore, first height H1 of PCB 10 is increased in contrast with the increasing demand for size reduction. In addition, capacitive passive element 15 and resistive passive element 17 mounted in the conventional semiconductor module are exposed. Thus, an electrode of capacitive passive element 15 or resistive passive element 17 may be damaged during module handling, thereby compromising quality.

One way to solve the above referenced problems is a passive element embedded PCB which provides integrating the passive element (such as a resistor or capacitor) into the board. The passive element is not mounted on or connected to a surface of the PCB. This provides a high integration mounting area reducing the size of the passive element embedded PCB. However, a conventional passive element embedded PCB is not reworkable and requires an additional PCB having a passive element, thereby increasing semiconductor fabrication costs.

SUMMARY OF THE INVENTION

Exemplary embodiments of the present invention are directed to a reworkable passive element embedded printed circuit board (PCB). In an exemplary embodiment, the reworkable passive element embedded PCB includes a board member, first and second fillings, a first passive element and a first insertion groove. The board member has first and second through holes spaced apart from each other. The first and second fillings are buried in the first and second through holes, respectively, and are formed of a reflowable conductive material. The passive element has first and second electrodes. The first insertion groove is formed in a portion of a surface of the board member between the first and second through holes and portions of the first and second fillings contacting the portion of the board member. The first passive element is mounted on the first insertion groove. The first electrode has a bottom surface and a side contacting the first filling and an exposed upper surface. The second electrode has a bottom surface and a side contacting the second filling and an exposed upper surface.

DESCRIPTION OF EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 2:
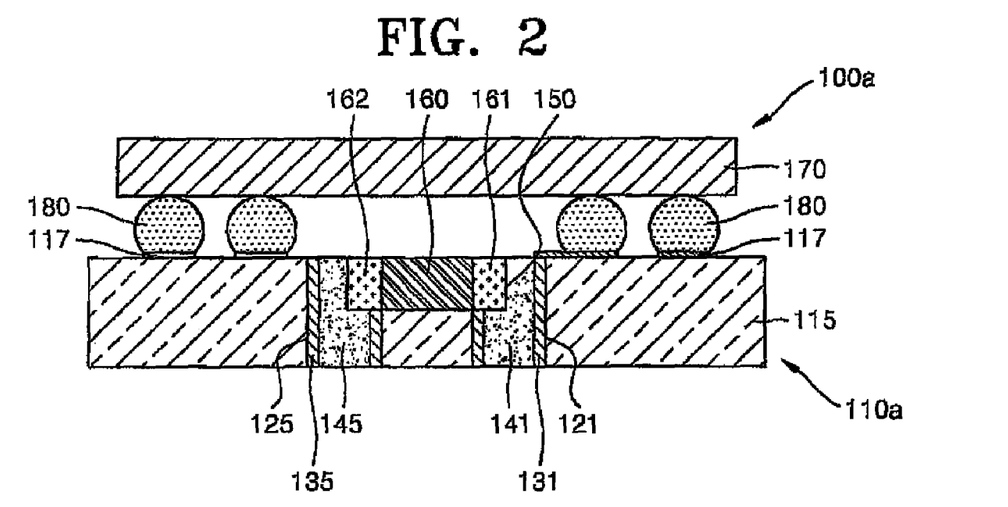
FIG. 2 is a cross-sectional view of a semiconductor module including a reworkable passive element embedded PCB according to an embodiment of the present invention.

FIG. 2 is a cross-sectional view of semiconductor module 100a including a reworkable passive element embedded PCB 110a, passive element 160 embedded in PCB 110a, and a semiconductor package 170 mounted on PCB 110a. PCB 110a includes board member 115 having an insulating resin such as polyimide. A plurality of distribution patterns 117 are arranged on a surface of board member 115 and may, for example, include copper. A plurality of connection terminals or bumps 180 are disposed between the surfaces of semiconductor package 170 and connected to distribution patterns 117. Although not shown, a plurality of distribution patterns may be arranged on the surface of the semiconductor package 170 corresponding to the location of the plurality of connection terminals 180.

First and second through holes 121 and 125 are formed through board member 115. A first distribution layer 131 is formed on a sidewall of first through hole 121, and a second distribution layer 135 is formed on a sidewall of second through hole 125. The first and second distribution layers 131 and 135 may include copper. A first filling 141 is buried in first through hole 121 and a second filling 145 is buried in second through hole 125. The first and second fillings 141 and 145 include conductive materials such as, for example, solder which can reflow. Insertion groove 150 is formed between first and second through holes 121 and 125 of board member 115 and in portions of first and second through holes 121 and 125. Passive element 160 is mounted on insertion groove 150.

A first electrode 161 of passive element 160 has a side contacting first filling 141, a bottom surface contacting first distribution layer 131 and first filling 141, and an exposed upper surface. A second electrode 162 has a side contacting the second filling 145, a bottom surface contacting the second distribution layer 135 and the second filling 145, and an upper surface which is exposed. For example, passive element 160 may include a capacitor, a resistor, or like component. If passive element 160 is a resistor, first and second electrodes 161 and 162 may include Ag/Ni/Sn. If passive element 160 is a capacitor, first and second electrodes 161 and 162 may include Cu/Ni/Sn. First electrode 161 contacts first distribution layer 131 and first filling 141 to be connected to a corresponding one of the plurality of distribution patterns 117. Second electrode 162 contacts second distribution layer 135 via second filling 145 to be connected to corresponding one of a plurality of pins in a terminal part (as shown in FIG. 1A at 14*a*) of PCB 110*a*.

The PCB 110*a* includes passive element 160 and thus requires only an area in which the semiconductor package 170 is mounted and the terminal part to accommodate an electrical connection. In contrast, second area 11 of PCB 20 in FIGS. 1A and 1B in which capacitive passive element 15 is mounted and the third area 13 of PCB 20 in which resistive passive element 17 are mounted are each no longer required. Thus, the height of PCB 110*a* is reduced as compared to the height of PCB 20.

Since passive element 160 is mounted on insertion groove 150 by first and second fillings 141 and 145, PCB 110*a* is reworkable in that passive element 160—may be separated from PCB 110*a* to install a new passive element. This may be needed if, for example, an error occurs in passive element 160 during a test process where a reflow process causes first and second fillings 141 and 145 to melt. FIGS. 3A through 3E are cross-sectional views for illustrating a method of fabricating the reworkable passive element embedded PCB illustrated in FIG. 2. Board member 115 is provided on the surface of which a plurality of distribution patterns 117 is arranged. The distribution patterns 117 may be arranged on both surfaces of board member 115. First and second through holes 121 and 125 are formed in board member 115 using a mechanical or laser drill that penetrates the board member 115. First and second distribution layers 131 and 135 are formed on the sidewalls of first and second through holes 121 and 125, respectively. Although not shown, the first distribution layer 131 is connected to the corresponding one of the plurality of distribution patterns 117, and second distribution layer 135 is connected to the corresponding one of the plurality of pins arranged in the terminal part (corresponding to the terminal part 14 of FIG. 1A).

Figure 3A:
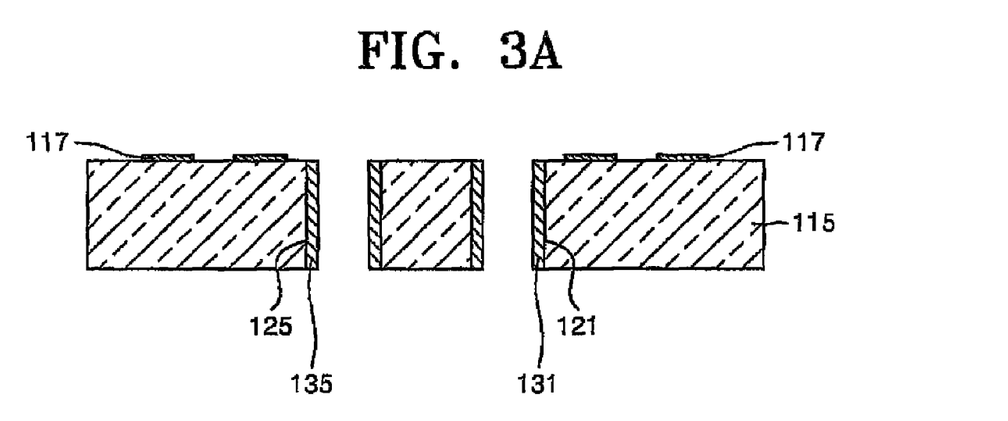
FIGS. 3A through 3E are cross-sectional views illustrating a method of fabricating the reworkable passive element embedded PCB illustrated in FIG. 2, according to an embodiment of the present invention.
Figure 3B:
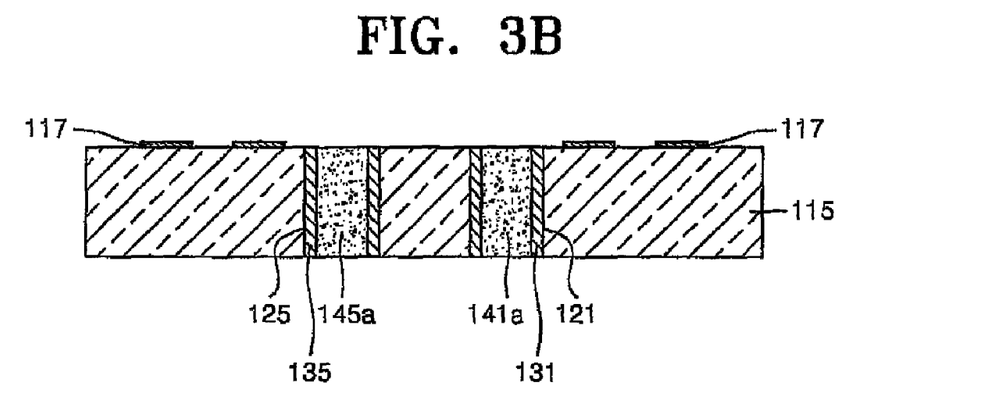
Figure 3C:
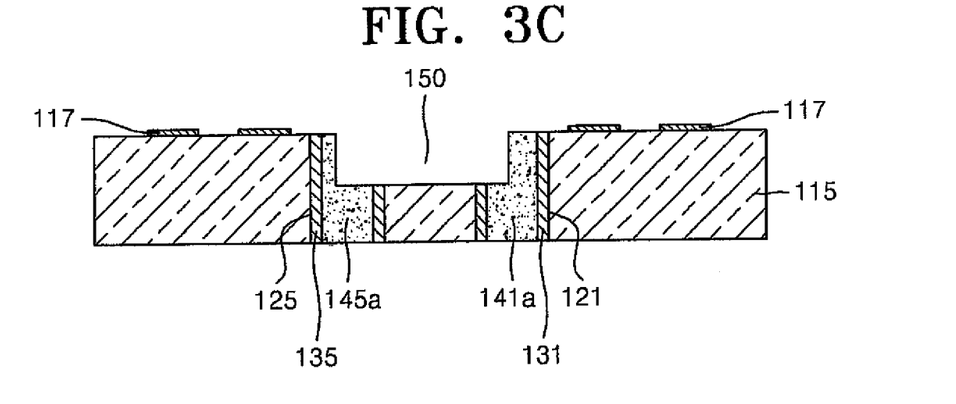

Referring to FIG. 3B, first and second fillings 141*a* and 145*a* are buried in the first and second through holes 121 and 125, respectively. The first and second fillings 141*a* and 145*a* may include solders as conductive materials, which can reflow. Referring to FIG. 3C, the portion between the first and second through holes 121 and 125 of the board member 115 and the portions of the first and second distribution layers 131 and 135 and portions of the first and second fillings 141*a* and 145*a* are etched using a mechanical or laser drill to form insertion groove 150.

Figure 3D:
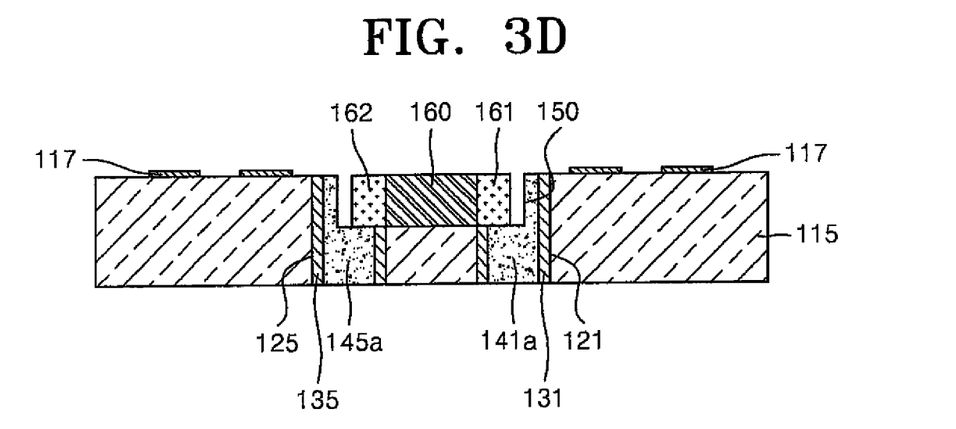

Referring to FIG. 3D, passive element 160 is mounted on insertion groove 150 so that a bottom surface of passive element 160 contacts a portion of board member 115 between first and second through holes 121, 125 and first and second distribution layers 131, 135 and portions of first and second fillings 141*a*, 145*a* buried in first and second through holes 121, 125. Insertion groove 150 has a wider width as compared to passive element 160 so that a side of passive element 160 is separated from the interior walls of insertion groove 150. Insertion groove 150 has substantially the same depth as the height of passive element 160 so that passive element 160 is kept substantially at the same level as the surface of board member 115.

Figure 3E:
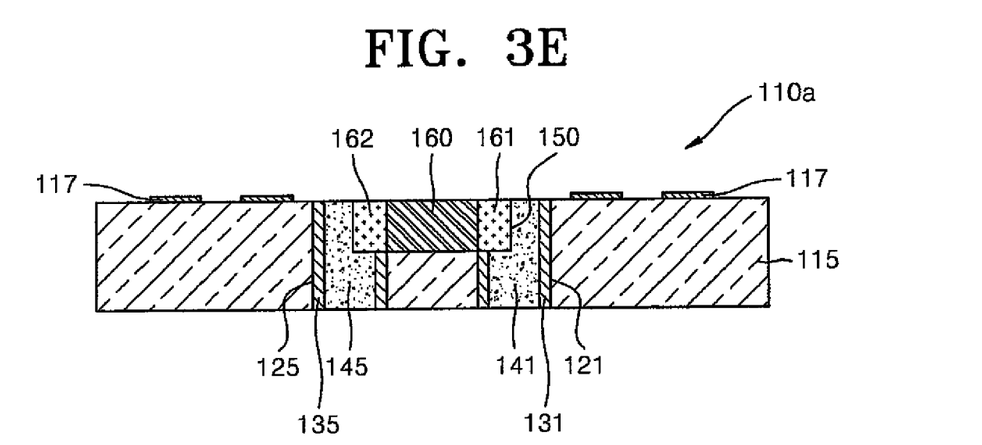

Referring to FIG. 3E, the first and second fillings 141*a* and 145*a* reflow in a reflow process to bury insertion groove 150 and fabricate PCB 110*a*. First electrode 161 of passive element 160 contacts first distribution layer 131 and first filling 141*a* which has reflowed so as to connect to the corresponding one of the plurality of distribution patterns 117 arranged on the surface of board member 115. Second electrode 162 of passive element 160 contacts the second distribution layer 135 and second filling 145*a* which has reflowed to connect to the corresponding one of the plurality of pins arranged in the terminal part (corresponding to 14 of FIG. 1A). Before passive element 160 is mounted on insertion groove 150, first and second electrodes 161 and 162 of passive element 160 are treated to improve wetting of first and second electrodes 161 and 162 and first and second fillings 141 and 145. This treatment may be performed using, for example, an acid-based chemical. Distribution patterns 117 of PCB 110 contact bumps 180 formed on semiconductor package 170 to obtain the semiconductor module 100*a* shown in FIG. 2.

Figure 4:
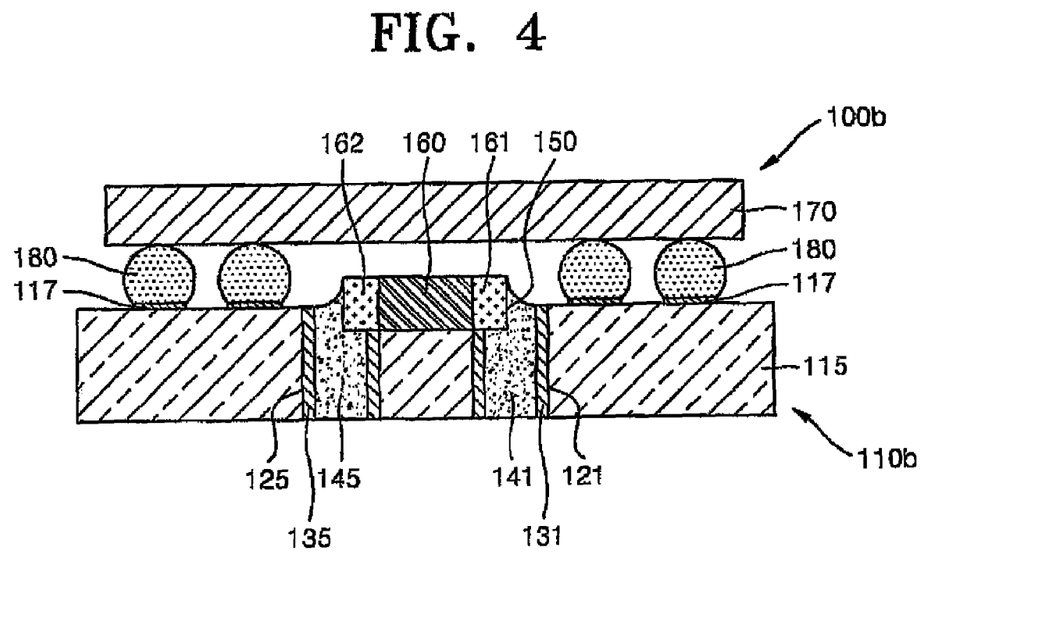
FIG. 4 is a cross-sectional view of a semiconductor module including a reworkable passive element embedded PCB according to another embodiment of the present invention.

FIG. 4 is a cross-sectional view of a semiconductor module 100*b* including a semiconductor package 170 and PCB 110*b* in which passive element 160 is embedded. PCB 110*b* is different from PCB 110*a* in that passive element 160 is mounted in PCB 110*b* and protrudes from the surface of board member 115. PCB 110*b* includes insertion groove 150 which is formed to a lower depth than a height of passive element 160. Passive element 160 is mounted on insertion groove 150 so that passive element 160 protrudes above the surface of board member 115, but remains lower than the height of connection terminals 180 of semiconductor package 170. The height of PCB 110*b* is reduced more than the height of PCB 20 illustrated in FIGS. 1A and 1B. A structure and method of fabricating the semiconductor module 100*b* are the same as those of the semiconductor module 100*a* illustrated in FIG. 2.

Figure 5:
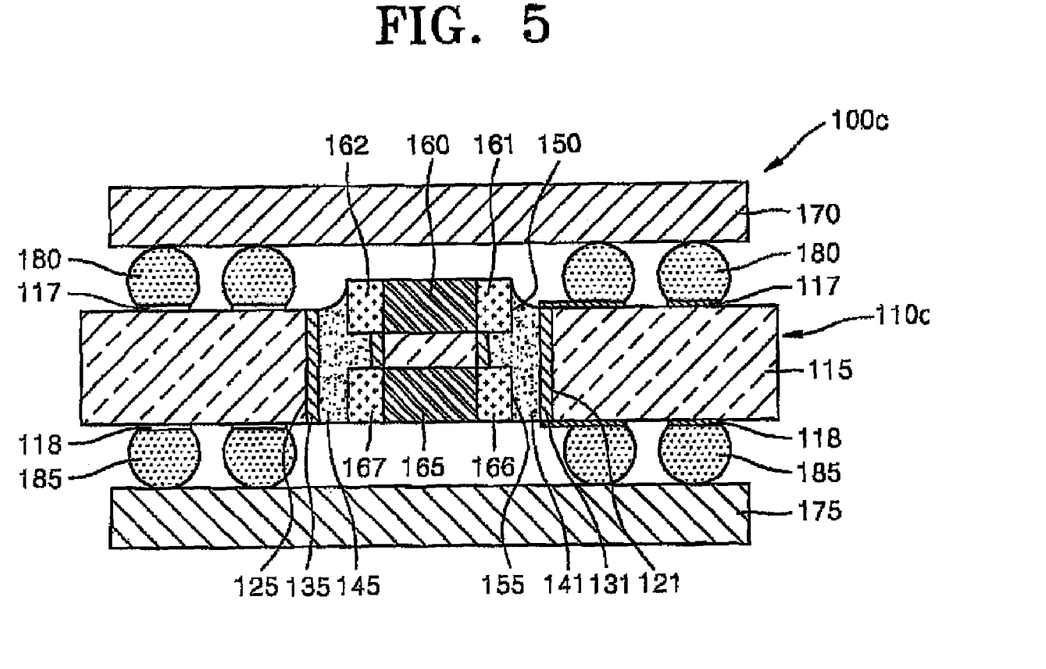
FIG. 5 is a cross-sectional view of a semiconductor module including a reworkable passive element embedded PCB according to another embodiment of the present invention.

FIG. 5 is a cross-sectional view of a semiconductor module 100*c* including PCB 110*c* having board member 115, first and second passive elements 160 and 165 embedded in PCB 110*c*, and first and second semiconductor packages 170 and 175 mounted on PCB 110c. A plurality of first distribution patterns 117 are arranged on a surface (top) of board member 115, and a plurality of second distribution patterns 118 are arranged on an opposite surface (bottom) of board member 115. The first and second distribution patterns 117 and 118 may include, for example, copper. A plurality of first connection terminals 180 are arranged on a surface of first semiconductor package 170, and a plurality of second connection terminals 185 arranged on a surface of second semiconductor package 175. First and second connection terminals 180 and 185 may include, for example, a plurality of bumps. Although not shown, first and second distribution patterns may be arranged on surfaces of first and second semiconductor packages 170 and 175 so that first connection terminals 180 are arranged on the first distribution pattern and second connection terminals 185 are arranged on the second distribution patterns. First distribution patterns 117 of PCB 110c are connected to first connection terminals 180 of first semiconductor package 170, and second distribution patterns 118 are connected to second connection terminals 185 of second semiconductor package 175.

First and second through holes 121 and 125 are formed in board member 115 in spaced relation to one another. First distribution layer 131 is formed on a sidewall of first through hole 121 and a second distribution layer 135 is formed on a sidewall of second through hole 125. Each of first and second distribution layers 131 and 135 may include copper. First filling 141 is buried in first through hole 121, and a second filling 145 is buried in second through hole 125. The first and second fillings 141 and 145 include conductive materials such as, for example, solder which can reflow.

First insertion groove 150 having a first depth is formed in a portion of the surface (top) of board member 115 between first and second through holes 121 and 125, first and second distribution layers 131 and 135, and in portions of first and second through holes 121 and 125. Second insertion groove 155 having a second depth is formed in a portion of the opposite surface (bottom) of board member 115 between first and second through holes 121 and 125, first and second distribution layers 131 and 135, and in portions of first and second through holes 121 and 125. First passive element 160 is mounted on first insertion groove 150 and second passive element 165 is mounted on second insertion groove 155. First insertion groove 150 is formed so that the first depth of first insertion groove 150 is lower than the height of first passive element 160. In this manner, first passive element 160 is embedded so as to protrude above the surface of board member 115. Similarly, second insertion groove 155 is formed so that its depth is substantially equal to the height of second passive element 165. Thus, second passive element 165 is embedded such that its upper surface is substantially at the same level as the lower or opposite surface of board member 115. Both first and second passive elements 160 and 165 may protrude from the surface of board member 115 or may be substantially at the same level as the surface of board member 115.

A first electrode 161 of first passive element 160 has a side contacting, a bottom surface contacting first distribution layer 131 and first filling 141, and an upper surface which protrudes above the top surface of board member 115. A second electrode 162 of the first passive element 160 has a side contacting second filling 145, a bottom surface contacting second distribution layer 135 and an upper surface which protrudes above the top surface of board member 115. A first electrode 166 of the second passive element 165 has a side contacting first filling 141, a bottom surface contacting first distribution layer 131 and an exposed upper surface. A second electrode 167 of second passive element 165 has a side contacting the second filling 145, a bottom surface contacting the second distribution layer 135 and an exposed upper surface.

First and second passive elements 160 and 165 may be of the same type for example, capacitors or resistors. If first passive element 160 is a resistor, the first and second electrodes 161 and 162 may include Ag/Ni/Sn. Similarly, if second passive element 165 is also a resistor, the first and second electrodes 166 and 167 may include Ag/Ni/Sn. If the first and second passive elements 160 and 165 are capacitors, first and second electrodes 161 and 162 of element 160, and electrodes 166 and 167 of element 165 may include Cu/Ni/Sn. First electrode 161 of first passive element 160 contacts first distribution layer 131 and first filling 141 to connect to a corresponding one of the plurality of first distribution patterns 117. First electrode 166 of second passive element 165 contacts first distribution layer 131 and first filling 141 is connected to a corresponding one of the plurality of second distribution patterns 118. Second electrodes 162 and 167 of first and second passive elements 160 and 165 contact first distribution layer 135 and second filling 145 to form a connection to corresponding one of a plurality of pins of a terminal part (corresponding to 14 of FIG. 1A) of PCB 110c.

Figure 6A:
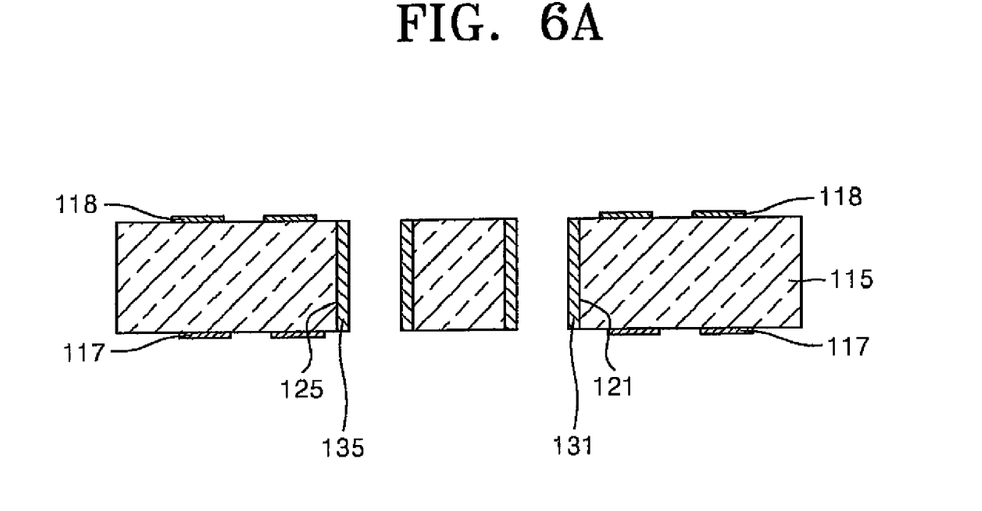
FIGS. 6A through 6E are cross-sectional views illustrating a method of fabricating the reworkable passive element embedded PCB illustrated in FIG. 5, according to another embodiment of the present invention.

FIGS. 6A through 6E are cross-sectional views of reworkable passive element embedded PCB 100c used to illustrate an associated fabrication method. Referring to FIG. 6A, a plurality of first distribution patterns 117 are arranged on a surface of board member 115 and a plurality of second distribution patterns 118 are arranged on an opposite surface of board member 115. First and second through holes 121 and 125 are formed in board member 115 using a mechanical or laser drill. First and second distribution layers 131 and 135 are formed on the sidewalls of first and second through holes 121 and 125, respectively. Although not shown, first distribution layer 131 is connected to corresponding one of the plurality of first distribution patterns 117 and corresponding one of the plurality of second distribution patterns 118. Second distribution layer 135 is connected to the terminal part corresponding to reference 14 of FIG. 1A.

Figure 6B:
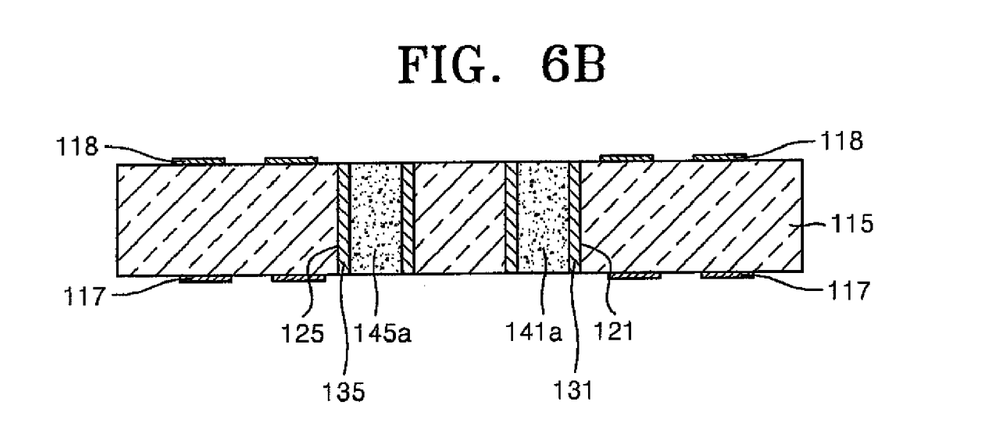
Figure 6C:
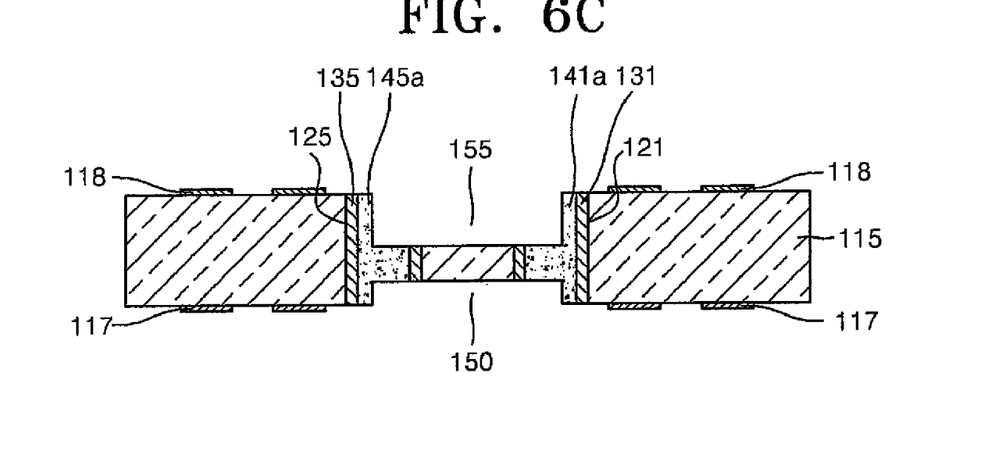

Referring to FIG. 6B, first and second fillings 141a and 145a are buried in first and second through holes 121 and 125. First and second fillings 141a and 145a may include conductive materials such as solders that can reflow. Referring to FIG. 6C, board member 115 is etched using a mechanical or laser drill to form first insertion groove 150 in the surface of board member 115 and to form second insertion groove 155 in the opposite surface of board member 115. First insertion groove 150 is formed in a portion of the surface of board member 115 between first and second through holes 121 and 125 as well as in first and second distribution layers 131 and 135 and in portions of first and second fillings 141 and 145. Second groove 155 is formed in a portion of the opposite surface of board member 115 between first and second through holes 121 and 125, in first and second distribution layers 131 and 135 and in portions of first and second fillings 141 and 145.

Figure 6D:
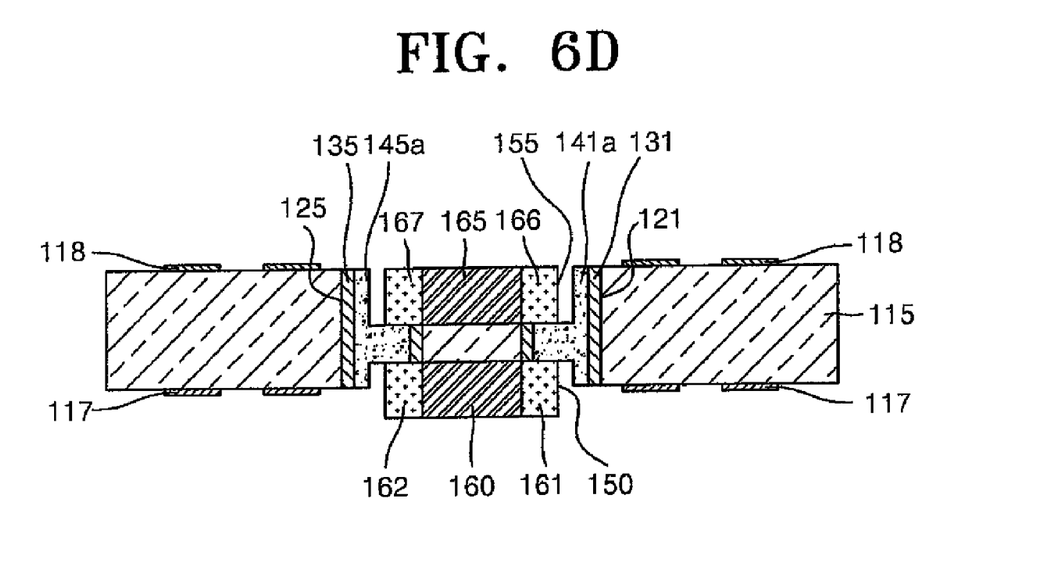

Referring to FIG. 6D, first passive element 160 is mounted on first insertion groove 150, and the second passive element 165, which is the same type as the first passive element 160, is mounted on second insertion groove 155. First passive element 160 contacts board member 115 between first and second through holes 121 and 125, and first and second distribution layers 131 and 135 and the first and second fillings 141a and 145a buried in first and second through holes 121 and 125 in the first insertion grooves. Second element 165 contacts board member 115 between first and second through holes 121 and 125, first and second distribution layers 131 and 135 and first and second fillings 141a and 145b buried in first and second through holes 121 and 125 in second insertion groove 150. First and second insertion grooves 150 and 155 are formed with wider widths than first and second passive elements 160 and 165 so that sides of first and second passive elements 160 and 165 are separated from the sides of first and second insertion grooves 150 and 155. Second insertion groove 155 is formed to substantially the same depths as a height of second passive element 165 so that an upper surface of second passive element 165 is substantially on the same level as the opposite surface of board member 115. First insertion groove 150 is formed to a higher depth than the height of first passive element 160 so that first passive element 160 protrudes from the surface of board member 115.

Figure 6E:
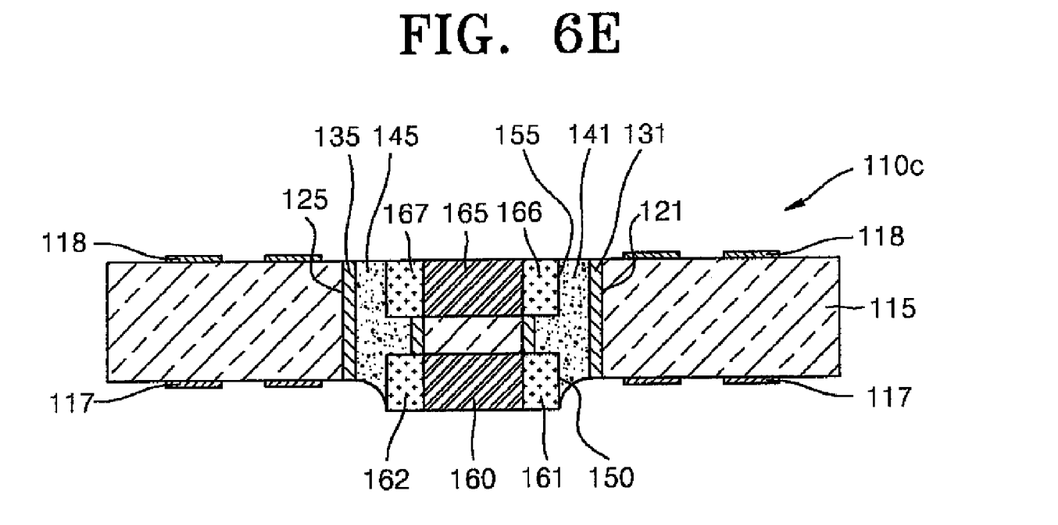

Referring to FIG. 6E, first and second fillings 141a and 145a reflow in a reflow process to bury first and second insertion grooves 150 and 155 to fabricate PCB 110c. If first distribution pattern 117 of PCB 110c contacts first connection terminals 180 of first semiconductor package 170, and second distribution patterns 118 contact second connection terminals 185 of second semiconductor package 175, semiconductor module 100c illustrated in FIG. 2C is obtained.

Figure 7:
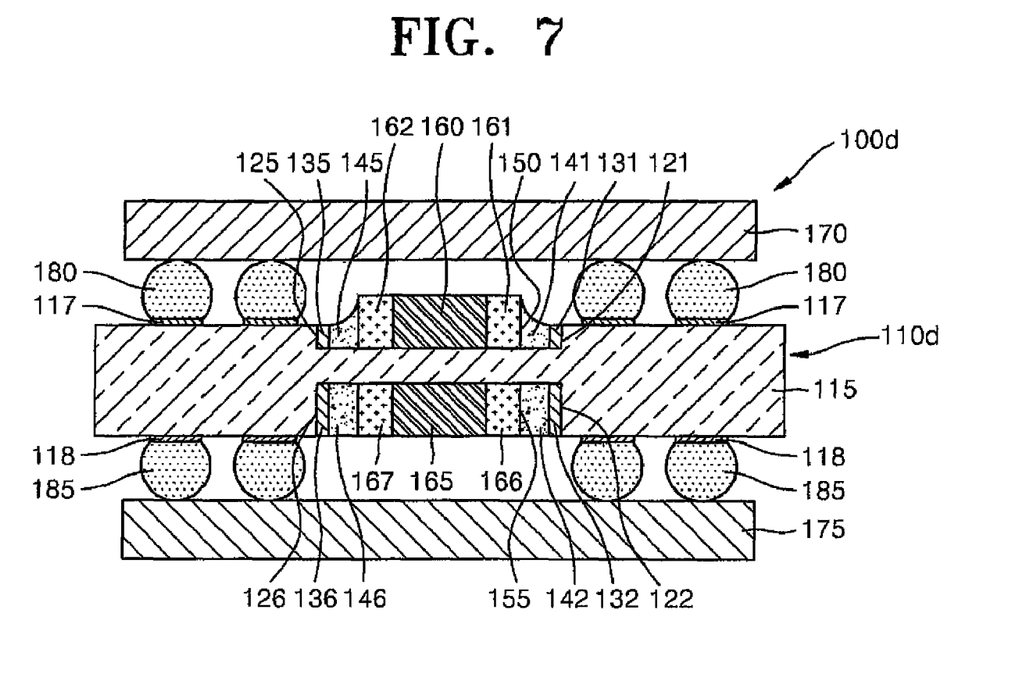
FIG. 7 is a cross-sectional view of a semiconductor module including a reworkable passive element embedded PCB according to another embodiment of the present invention.

FIG. 7 is a cross-sectional view of a semiconductor module 100d including PCB 110d, first and second passive elements 160 and 165 embedded in PCB 110d, and first and second semiconductor packages 170 and 175 mounted on first PCB 110d. Structures and connection states of first and second distribution patterns 117 and 118 of PCB 110d and structures and connection states of first and second connection terminals 180 and 185 of first and second semiconductor packages 170 and 175 are the same as those of semiconductor module 100c. First and second through holes 121 and 125 are formed in a surface of board member 115. Third and fourth through holes 122 and 126 are formed in an opposite surface of board member 115 and opposite to first and second through holes 121 and 125. First, second, third, and fourth through holes 121, 125, 122, and 126 are formed in board member 115 to predetermined depths without penetrating through board member 115. Thus, first and second through holes 121 and 125 are separated from third and fourth through holes 122 and 126 by board member 115. First and second distribution layers 131 and 135 are respectively formed on sidewalls of first and second through holes 121 and 125, and third and fourth distribution layers 132 and 136 are respectively formed on sidewalls of third and fourth through holes 122 and 126. First, second, third, and fourth distribution layers 131, 135, 132, and 136 may include copper. First and second fillings 141 and 145 are buried in first and second through holes 121 and 125, and third and fourth fillings 142 and 146 are buried in third and fourth through holes 122 and 126. First, second, third, and fourth fillings 141, 145, 142, and 146 may include conductive materials such as solder, which can reflow. First insertion groove 150 having a first depth is formed in a portion of the surface of board member 115 between first and second through holes 121 and 125 and in portions of first and second through holes 121 and 125. Second insertion groove 155 having a second depth is in a portion of the opposite surface of board member 115 between third and fourth through holes 122 and 126 and in portions of the third and fourth through holes 122 and 126. Second insertion groove 155 is opposed to first insertion groove 150. First passive element 160 is mounted on first insertion groove 150, and second passive element 165 is mounted on second insertion groove 155.

A first electrode 161 of first passive element 160 has a side contacting the first filling 141, a bottom surface contacting first distribution layer 131 and first filling 141, and an upper surface which protrudes from board member 115. A second electrode 162 of first passive element 160 has a side contacting second filling 145, a bottom surface contacting second distribution layer 135 and second filling 145, and an upper surface which protrudes from board member 115. A first electrode 166 of second passive element 165 has a side contacting third filling 142, a bottom surface contacting third distribution layer 132 and third filling 142, and an exposed upper surface. A second electrode 167 of second passive element 165 has a side contacting fourth filling 146, a bottom surface contacting fourth distribution layer 136 and fourth filling 146, and an exposed upper surface.

First and second passive elements 160 and 165 may be the same type (e.g. resistors or capacitors) of passive elements or may be different types of passive elements. If first passive element 160 is a resistor, the first and second electrodes 161 and 162 may include Ag/Ni/Sn. Similarly, if second passive element 165 is also a resistor, first and second electrodes 166 and 167 may include Ag/Ni/Sn. If the first and second passive elements 160 and 165 are capacitors, first and second electrodes 161 and 162 of element 160, and electrodes 166 and 167 of element 165 may include Cu/Ni/Sn. First electrode of first passive element 160 contacts first distribution layer 131 and first filling 141 is connected to corresponding one of the plurality of first distribution patterns 117. Second electrode 162 of first passive element 160 contacts second distribution layer 135 and second filling 145 to connect to corresponding one of a plurality of pins arranged in a terminal part (corresponding to 14 of FIG. 1A) of PCB 110d. First electrode 166 of second passive element 165 contacts third distribution layer 132 and third filling 142 connects to corresponding one of the plurality of second distribution patterns 118. Second electrode 167 of second passive element 165 contacts fourth distribution layer 136 and fourth filling 146 connects to another corresponding one of the plurality of pins arranged in the terminal part (corresponding to 14 of FIG. 1A) of PCB 110d.

Figure 8A:
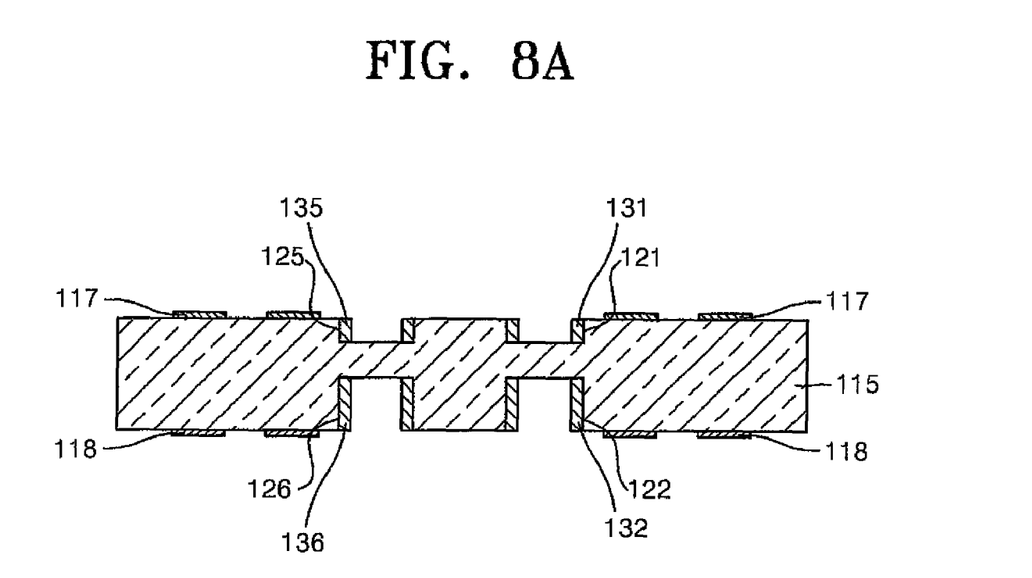
FIGS. 8A through 8E are cross-sectional views illustrating a method of fabricating the reworkable passive element embedded PCB illustrated in FIG. 7, according to an embodiment of the present invention.

FIGS. 8A through 8E are cross-sectional views illustrating a method of fabricating the reworkable passive element embedded PCB 110d illustrated in FIG. 7. Referring to FIG. 8A, a plurality of first distribution patterns 117 are arranged on a surface of board member 115. A plurality of second distribution patterns 118 are arranged on an opposite surface of board member 115. Portions of board member 115 are etched using a mechanical or laser drill to form first and second through holes 121 and 125 in the surface of board member 115 and to form third and fourth through holes 122 and 126 in the opposite surface of board member 115. Third and fourth through holes 122 and 126 are opposed to first and second through holes 121 and 125, respectively. First and second distribution layers 131 and 135 are formed on the sidewalls of first and second through holes 121 and 125, and third and fourth distribution layers 132 and 136 are formed on the sidewalls of third and fourth through holes 122 and 126. Although not shown, first distribution layer 131 is connected to the corresponding one of the plurality of first distribution patterns 117, and second distribution layer 135 is connected to the terminal part (corresponding to the terminal part 14 of FIG. 1A). Third distribution layer 132 is connected to the corresponding one of the plurality of second distribution patterns 118, and fourth distribution layer 136 is connected to the terminal part (corresponding to the terminal part 14 of FIG. 1A).

Figure 8B:
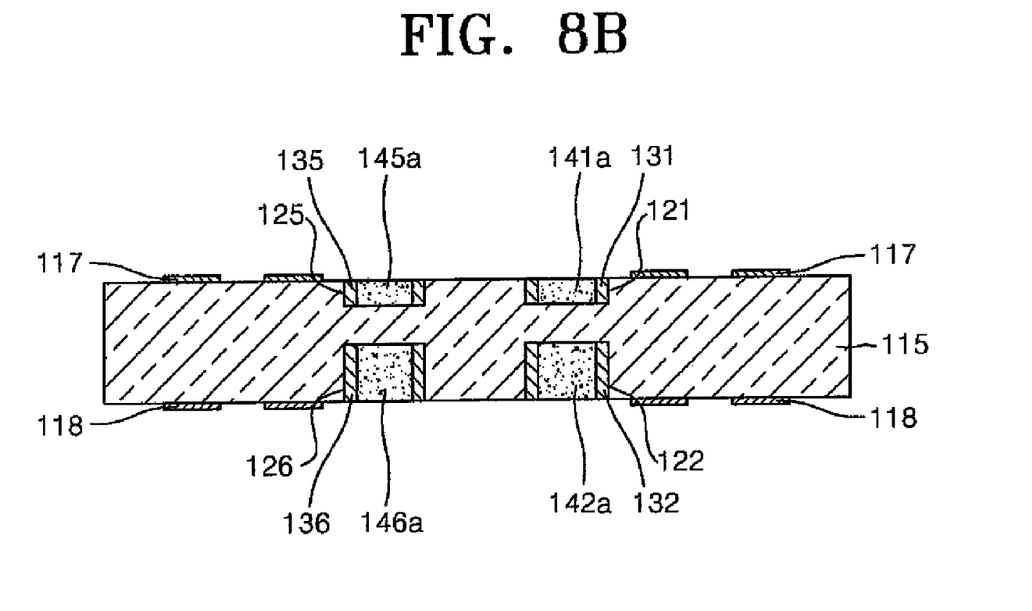
Figure 8C:
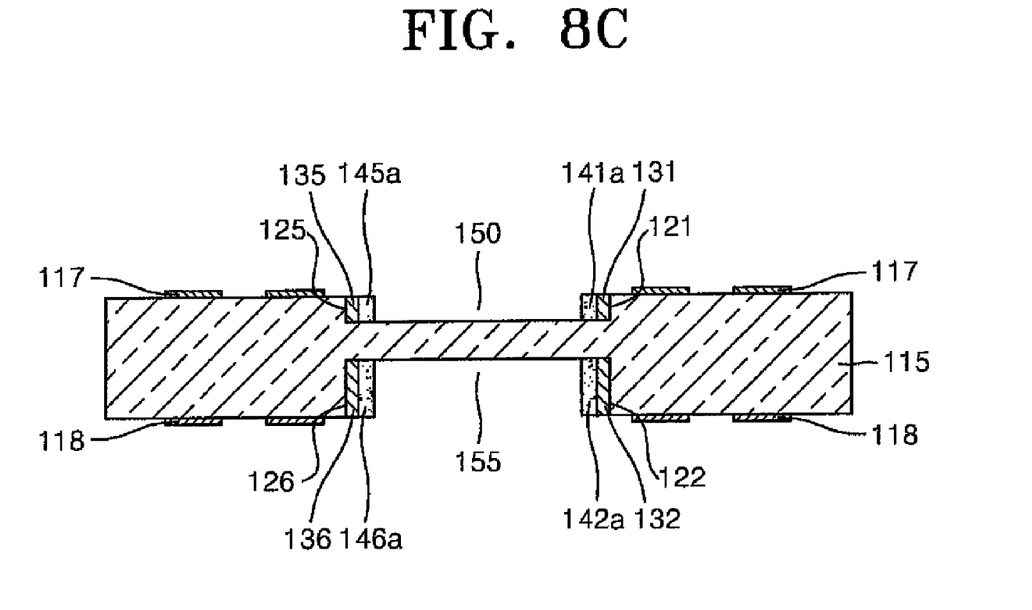

Referring to FIG. 8B, first and second fillings 141a and 145a are buried in the first and second through holes 121 and 125 respectively and third and fourth fillings 142a and 146a are buried in the third and fourth through holes 122 and 126 respectively. Referring to FIG. 8C, board member 115 is etched using a mechanical or laser drill to form first insertion groove 150 in the surface of board member 115 and second insertion groove 155 is formed in the opposite surface of board member 115. First insertion groove 150 is formed in the portion of the surface of board member 115 between first and second through holes 121 and 125, and in first and second distribution layers 131 and 135, and in portions of first and second fillings 141a and 145a. Second insertion groove 155 is formed in the portion of the opposite surface of board member 115 between third and fourth through holes 122 and 126, in third and fourth distribution layers 132 and 136, and in portions of the third and fourth fillings 142a and 146a.

Figure 8D:
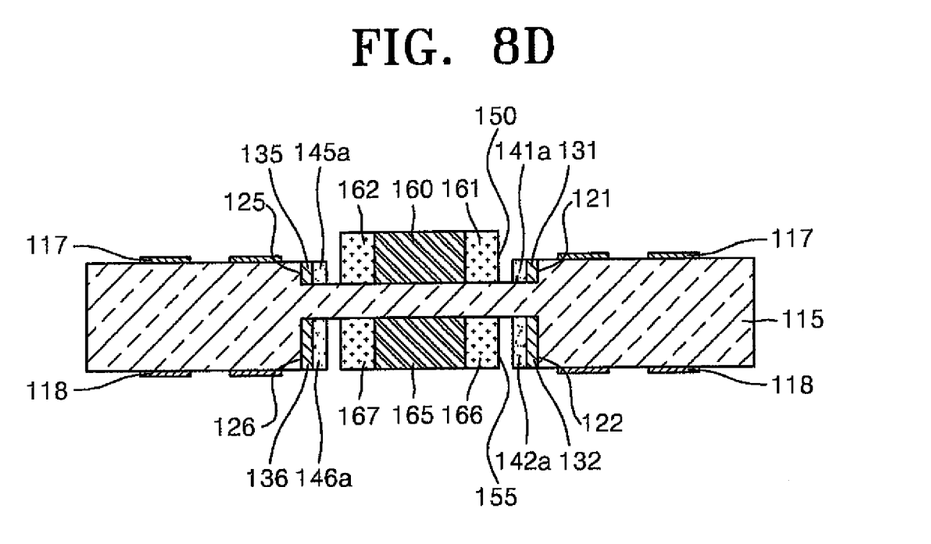

Referring to FIG. 8D, first passive element 160 is mounted on first insertion groove 150, and second passive element 165 is mounted on second insertion groove 155. First passive element 160 contacts board member 115 between first and second through holes 121 and 125, first and second distribution layers 131 and 135 and first and second fillings 141a and 145b which are buried in first and second through holes 121 and 125 in first insertion groove 150. Second passive element 165 contacts board member 115 between third and fourth through holes 122 and 126, and third and fourth distribution layers 132 and 136 and first and second fillings 142a and 146a buried in third and fourth through holes 122 and 126 in second insertion groove 155. Here, first and second insertion grooves 150 and 155 are formed with wider widths than widths of first and second passive elements 160a and 165 so that sides of first and second passive elements 160 and 165 are separated from sides of first and second insertion grooves 150 and 155. Second insertion groove 155 is formed to substantially the same depth as the height of second passive element 165 so that second passive element 165 is at substantially the same level as the opposite surface of board member 115. First insertion groove 150 is formed to a lower depth than the height of first passive element 160 so that first passive element protrudes from the surface of board member 115.

Figure 8E:
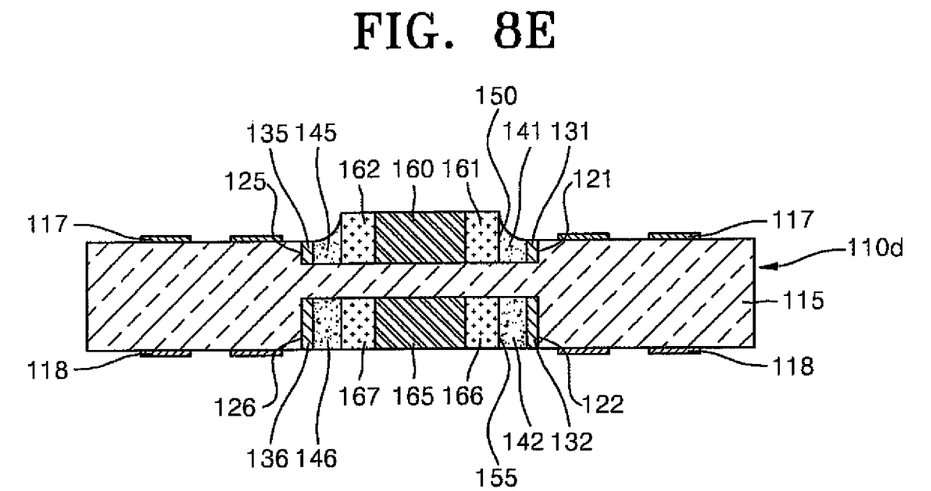

Referring to FIG. 8E, first, second, third, and fourth fillings 141a, 145a, 142a, and 146a reflow in a reflow process. In particular, first and second fillings 141a and 145a reflow to bury first insertion groove 150, and third and fourth fillings 142a and 146a reflow to bury second insertion groove 155 to fabricate PCB 110d. If first distribution patterns 117 of PCB 110d contact first connection terminals 180 of first semiconductor package 170, and second distribution patterns of PCB 110d contact second connection terminals 185 of second semiconductor package 175, semiconductor module 100d illustrated in FIG. 7 is obtained.

Alternatively, first insertion groove 150 may be formed so that its depth is lower than the depths of first and second through holes 121 and 125. In this manner, the bottom surfaces of first and second electrodes 161 and 162 of first passive element 160 may contact first and second fillings 141 and 145, respectively similar to that described with reference to FIGS. 4 and 5. Also, second insertion groove 155 may be formed so that a depth of second insertion groove 155 is lower than the depths of third and fourth through holes 122 and 126. Thus, the bottom surfaces of first and second electrodes 166 and 167 of second passive element 165 may contact third and fourth fillings 142 and 146.

As described herein, a reworkable passive element embedded PCB includes electrodes of a passive element that are connected to distribution patterns of the PCB using solder materials. Thus, the passive element can be embedded in the PCB and electrical shorts can be prevented as well as allowing reworkability of a poorly fabricated passive element. In addition, a bottom and side surface of the passive element can be soldered on the reworkable passive element embedded PCB. Thus, the reliability of the passive element is improved. Furthermore, the passive element can be embedded in a general PCB obviating the need for an additional PCB and avoiding additional fabrication costs.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A reworkable passive element embedded PCB (printed circuit board) comprising:
    a board member comprising first and second through holes spaced apart from each other;
    first and second fillings buried in the first and second through holes, respectively, said first and second fillings formed of a reflowable conductive material that melts in a reflow process;
    a removable first passive element having first and second electrodes; and
    a first insertion groove formed in an upper surface of the board member between the first and second through holes and between portions of the first and second fillings,
    wherein said first passive element is mounted in the first insertion groove, the first passive element having a bottom surface contacting the board member, the first electrode having a bottom surface and a side contacting the first filling, and said second electrode having a bottom surface and a side contacting the second filling, the first and second fillings at least partially embedding the removable first passive element in the PCB, and
    wherein the first passive element has an exposed upper surface that is not in contact with another structure, enabling removal of the first passive element upon melting of the reflowable conductive material in response to the reflow process.

2. The reworkable passive element embedded PCB of claim 1, further comprising:
    a plurality of first distribution patterns arranged on the upper surface of the board member; and
    first and second distribution layers formed on sidewalls of the first and second through holes, respectively, wherein the first distribution layer is connected to corresponding one of the plurality of first distribution patterns and directly contacts the bottom surface of the first electrode of the first passive element, the second distribution layer connected to corresponding one of a plurality of pins arranged in a terminal part of said PCB and directly contacts the bottom surface of the second electrode of the first passive element.

3. The reworkable passive element embedded PCB of claim 1, wherein the first and second through holes penetrate the board member.

4. The reworkable passive element embedded PCB of claim 3, further comprising:
    a second insertion groove formed in a bottom surface of the board member opposite from said upper surface and between the first and second through holes and between portions of the first and second fillings; and
    a removable second passive element mounted on the second insertion groove, the second passive element having third and fourth electrodes, and an upper surface contacting the board member;

wherein the third electrode of the second passive element has an upper surface and a side contacting the first filling, and the fourth electrode has an upper surface and a side contacting the second filling, the first and second fillings at least partially embedding the removable second passive element in the PCB, and wherein the second passive element has an exposed bottom surface that is not in contact with another structure, enabling removal of the second passive element upon melting of the reflowable conductive material in response to the reflow process.

5. The reworkable passive element embedded PCB of claim 4, further comprising:

a plurality of first distribution patterns arranged on the upper surface of the board member;

a plurality of second distribution patterns arranged on the bottom surface of the board member; and first and second distribution layers respectively formed on sidewalls of the first and second through holes, wherein the first distribution layer is connected to a corresponding one of the plurality of first distribution patterns and corresponding one of the plurality of second distribution patterns and directly contacts the bottom surface of the first electrode of the first passive element and the upper surface of the third electrode of the second passive element, the second distribution layer is connected to a corresponding one of the plurality of pins arranged in the terminal part of the board member and directly contacts the bottom surface of the second electrode of the first passive element and the upper surface of the fourth electrode of the second passive element.

6. A semiconductor module comprising:

a PCB having a board member with first and second through holes spaced apart from each other, first and second fillings buried in the first and second through holes and formed of reflowable conductive materials that melt in a reflow process, a first insertion groove formed in an upper surface of the board member between the first and second through holes and between portions of the first and second fillings, and a terminal part having a plurality of pins;

a first passive element having first and second electrodes and mounted in the first insertion groove of the PCB, wherein the first passive element has a bottom surface contacting the board member, the first electrode has a bottom surface and a side contacting the first filling, and the second electrode has a bottom surface and a side contacting the second filling, the first and second fillings at least partially embedding the removable first passive element in the PCB; and a first semiconductor package having a plurality of first connection terminals, wherein the first passive element has an exposed upper surface that is not in contact with another structure, enabling removal of the first passive element upon melting of the reflowable conductive materials in response to the reflow process.

7. The semiconductor module of claim 6, wherein the first and second fillings comprise solders.

8. The semiconductor module of claim 6, wherein the PCB further comprises:

a plurality of first distribution patterns arranged on the upper surface of the board member and connected to the plurality of the first connection terminals of the first semiconductor package; and first and second distribution layers respectively formed on sidewalls of the first and second through holes, wherein the first distribution layer is connected to a corresponding one of the plurality of first distribution patterns and directly contacts the bottom surface of the first electrode of the first passive element, and the second distribution layer is connected to a corresponding one of the plurality of pins of the terminal part and directly contacts the bottom surface of the second electrode of the first passive element.

9. The semiconductor module of claim 8, wherein the first and second through holes penetrate the board member.

10. The semiconductor module of claim 9, further comprising:

a second insertion groove formed in a bottom surface of the board member, between portions of the first and second distribution layers and between the first and second fillings; and a removable second passive element having third and fourth electrodes mounted in the second insertion groove, the second passive element having an upper surface contacting the board member, the third electrode having an upper surface and a side contacting the first filling, and the fourth electrode having an upper surface and a side contacting the second filling, the first and second fillings at least partially embedding the removable second passive element in the PCB, wherein the second passive element has an exposed bottom surface that is not in contact with another structure, enabling removal of the second passive element upon melting of the reflowable conductive materials in response to the reflow process.

11. The semiconductor module of claim 10, wherein the PCB further comprises:

a plurality of first distribution patterns arranged on the upper surface of the board member and connected to the plurality of the first connection terminals of the first semiconductor package; and first and second distribution layers respectively formed on sidewalls of the first and second through holes, wherein the first distribution layer is connected to a corresponding one of the plurality of first distribution patterns and directly contacts the bottom surface of the first electrode of the first passive element and the upper surface of the third electrode of the second passive element, and wherein the second distribution layer is connected to a corresponding one of the plurality of pins of the terminal part and directly contacts the bottom surface of the second electrode of the second passive element and the upper surface of the fourth electrode of the second passive element.

12. A reworkable passive element embedded printed circuit board (PCB) comprising:

a board member comprising first and second through holes spaced apart from each other;

first and second insertion grooves formed on opposite surfaces of the board member between the first and second through holes;

a removable first passive element having first and second electrodes mounted in the first insertion groove;

a removable second passive element having third and fourth electrodes mounted in the second insertion groove; and first and second fillings that fill the first and second through holes and portions of the first and second insertion grooves, respectively, to at least partially embed the removable first and second passive elements in the PCB, the first and second fillings being formed of a reflowable conductive material that melts in a reflow process, wherein a bottom surface of the first passive element and a top surface of the second passive element contact the board member, the first and second electrodes contact the first and second fillings, and the third and fourth electrodes contact the first and second filling, respectively, and wherein the first passive element has an exposed upper surface that is not in contact with another structure, and the second passive element has an exposed bottom surface that is not in contact with another structure, enabling removal of at least one of the first passive element and the second element upon melting of the reflowable conductive material of the first and second filling in response to the reflow process.

13. The reworkable passive element embedded PCB of claim 1, further comprising:
 a plurality of first distribution patterns connected to a plurality of first connection terminals, the plurality of first distribution patterns being arranged on the upper surface of the board member; and
 a plurality of second distribution patterns connected to a plurality of second connection terminals, the plurality of second distribution patterns being arranged on a bottom surface of the board member;
 wherein the first and second through holes penetrate the board member from the upper surface of the board member to the bottom surface of the board member.

14. The semiconductor module of claim 6, wherein the PCB further comprising:
 a plurality of first distribution patterns connected to a plurality of first connection terminals, the plurality of first distribution patterns being arranged on the upper surface of the board member; and
 a plurality of second distribution patterns connected to a plurality of second connection terminals, the plurality of second distribution patterns being arranged on a bottom surface of the board member;
 wherein the first and second through holes penetrate the board member from the upper surface of the board member to the bottom surface of the board member.

15. The reworkable passive element embedded PCB of claim 12, further comprising:
 a plurality of first distribution patterns connected to a plurality of first connection terminals, the plurality of first distribution patterns being arranged on an upper surface of the board member; and
 a plurality of second distribution patterns connected to a plurality of second connection terminals, the plurality of second distribution patterns being arranged on a bottom surface of the board member;
 wherein the first and second through holes penetrate the board member from the upper surface of the board member to the bottom surface of the board member.

* * * * *